(12) United States Patent
Long

(10) Patent No.: US 12,266,503 B2
(45) Date of Patent: Apr. 1, 2025

(54) HYBRID PLASMA SOURCE ARRAY

(71) Applicants: Beijing E-Town Semiconductor Technology Co., LTD, Bejing (CN); Mattson Technology, Inc., Fremont, CA (US)

(72) Inventor: Maolin Long, Santa Clara, CA (US)

(73) Assignees: Beijing E-Town Semiconductor Technology Co., LTD, Beijing (CN); Mattson Technology, Inc., Fremont, CA (US)

( * ) Notice: Subject to any disclaimer, the term of this patent is extended or adjusted under 35 U.S.C. 154(b) by 17 days.

(21) Appl. No.: 17/824,504

(22) Filed: May 25, 2022

(65) Prior Publication Data

US 2022/0384144 A1  Dec. 1, 2022

Related U.S. Application Data

(60) Provisional application No. 63/242,534, filed on Sep. 10, 2021, provisional application No. 63/192,712, filed on May 25, 2021.

(51) Int. Cl.
*H01J 37/32* (2006.01)

(52) U.S. Cl.
CPC ..... *H01J 37/3211* (2013.01); *H01J 37/32091* (2013.01); *H01J 37/32541* (2013.01); *H01J 37/32651* (2013.01); *H01J 2237/3343* (2013.01)

(58) Field of Classification Search
None
See application file for complete search history.

(56) References Cited

U.S. PATENT DOCUMENTS

| | | | |
|---|---|---|---|
| 7,837,826 B2* | 11/2010 | Marakhtanov | .... H01J 37/32091 118/723 AN |
| 7,976,674 B2 | 7/2011 | Brcka | |
| 8,159,134 B2* | 4/2012 | Eden | ........................ H01J 11/18 313/631 |
| 8,299,391 B2 | 10/2012 | Todorow et al. | |
| 8,604,697 B2 | 12/2013 | Kim | |
| 8,853,948 B2* | 10/2014 | Choi | ................... H01J 37/3222 315/111.41 |
| 9,528,185 B2 | 12/2016 | Nam et al. | |

(Continued)

FOREIGN PATENT DOCUMENTS

| | | |
|---|---|---|
| CN | 103959918 | 7/2014 |
| CN | 106558468 | 4/2017 |

(Continued)

*Primary Examiner* — Srinivas Sathiraju
(74) *Attorney, Agent, or Firm* — Dority & Manning, P.A.

(57) ABSTRACT

A plasma source array is provided. The plasma source array includes a plurality of hybrid plasma sourcelets disposed on a base plate. Each hybrid sourcelet includes a dielectric tube having an inner area and an outer surface; an inductively coupled plasma source for generating a inductively coupled plasma disposed proximate to the outer surface of the dielectric tube; a capacitively coupled plasma source for generating a capacitively coupled plasma disposed within the inner area of the dielectric tube; and a gas injection system configured to supply one or more process gases to the inner area of the dielectric tube. Plasma processing apparatuses incorporating the plasma source array and methods of use are also provided.

21 Claims, 15 Drawing Sheets

(56) References Cited

U.S. PATENT DOCUMENTS

| | | | |
|---|---|---|---|
| 9,984,857 B2 | 5/2018 | Mai | |
| 11,189,463 B2 | 11/2021 | Bennett | |
| 11,195,697 B2 | 12/2021 | Hayami et al. | |
| 2008/0020574 A1* | 1/2008 | Marakhtanov | H01J 37/321 |
| | | | 156/345.46 |
| 2008/0099450 A1 | 5/2008 | Lewington et al. | |
| 2010/0001629 A1* | 1/2010 | Eden | H01J 11/18 |
| | | | 445/35 |
| 2010/0193501 A1* | 8/2010 | Zucker | H01L 21/67248 |
| | | | 219/443.1 |
| 2011/0097901 A1 | 4/2011 | Banna et al. | |
| 2013/0278135 A1* | 10/2013 | Choi | H01J 37/3222 |
| | | | 315/111.41 |
| 2016/0042916 A1 | 2/2016 | Wang | |
| 2017/0092470 A1 | 3/2017 | Ramaswamy | |
| 2019/0103254 A1 | 4/2019 | Lane et al. | |
| 2020/0075346 A1* | 3/2020 | Ventzek | H01J 37/077 |
| 2021/0305071 A1* | 9/2021 | Wang | H01L 21/67069 |
| 2022/0208518 A1* | 6/2022 | Long | H01J 37/32091 |
| 2022/0384144 A1* | 12/2022 | Long | H01J 37/32541 |

FOREIGN PATENT DOCUMENTS

| | | |
|---|---|---|
| CN | 106575602 | 4/2017 |
| CN | 112786420 | 5/2021 |
| TW | 201628053 A | 8/2016 |

\* cited by examiner

HYBRID PLASMA SOURCE ARRAY

PRIORITY CLAIM

The present application claims priority to U.S. Provisional Patent Application Ser. No. 63/192,712, filed May 25, 2021, and U.S. Provisional Patent Application Ser. No. 63/242,534, filed Sep. 10, 2021, which is incorporated herein by reference for all purposes.

FIELD

The present disclosure relates generally to plasma processing apparatus for processing a workpiece, and more particularly to a plasma source array for a plasma processing apparatus.

BACKGROUND

Plasma processing is widely used in the semiconductor industry for deposition, etching, resist removal, and related processing of semiconductor wafers and other substrates. Plasma sources (e.g., microwave, ECR, inductive coupling, etc.) are often used for plasma processing to produce high density plasma and reactive species for processing substrates. In plasma dry strip processes, neutral species (e.g., radicals) from a plasma pass into a processing chamber to treat a workpiece, such as a semiconductor wafer. In plasma etch processes, radicals, ions, and other species generated in a plasma directly exposed to the workpiece can be used to etch and/or remove a material on a workpiece.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
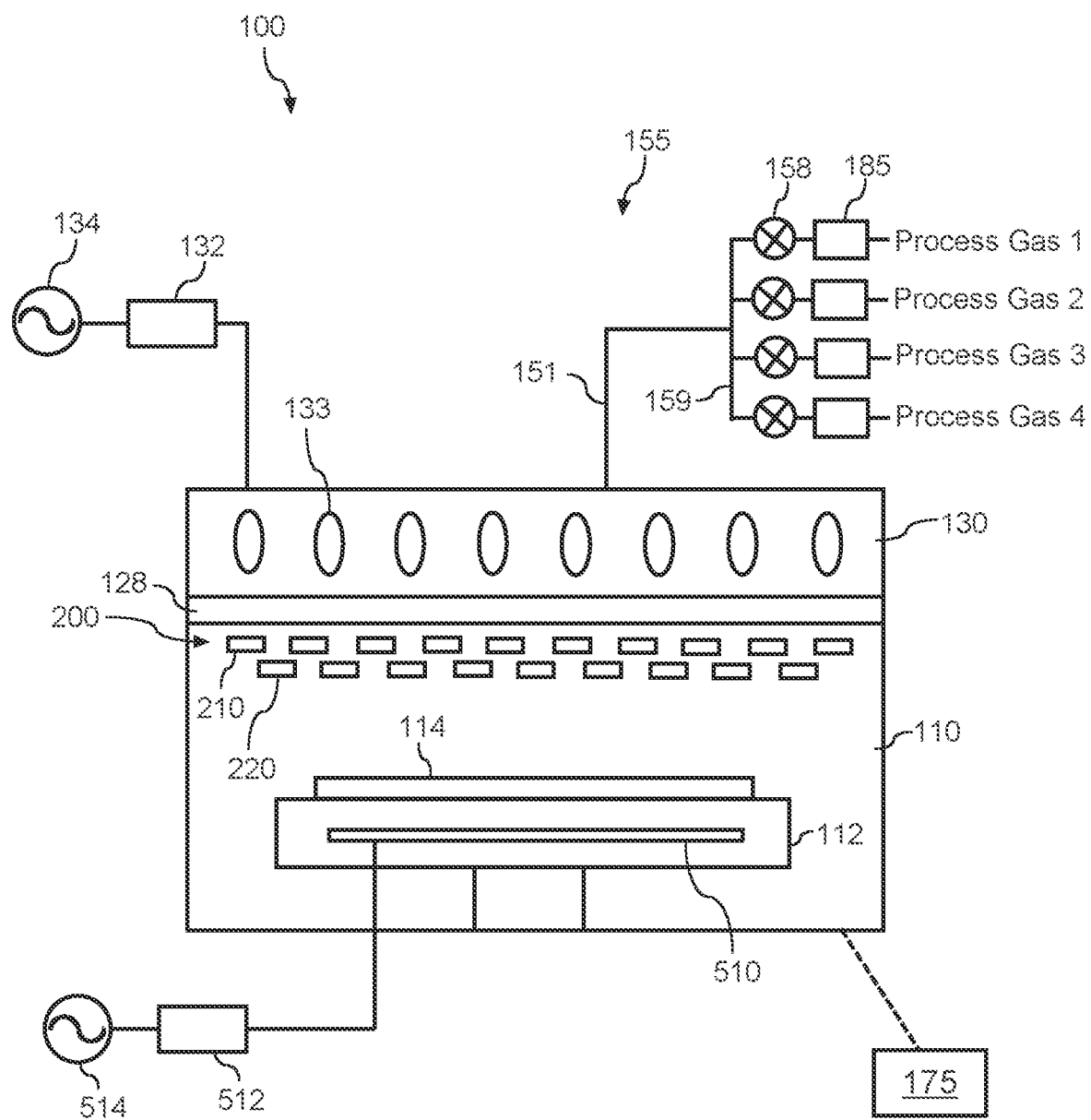
FIG. 1 depicts an example plasma processing apparatus according to example embodiments of the present disclosure.
Figure 2:
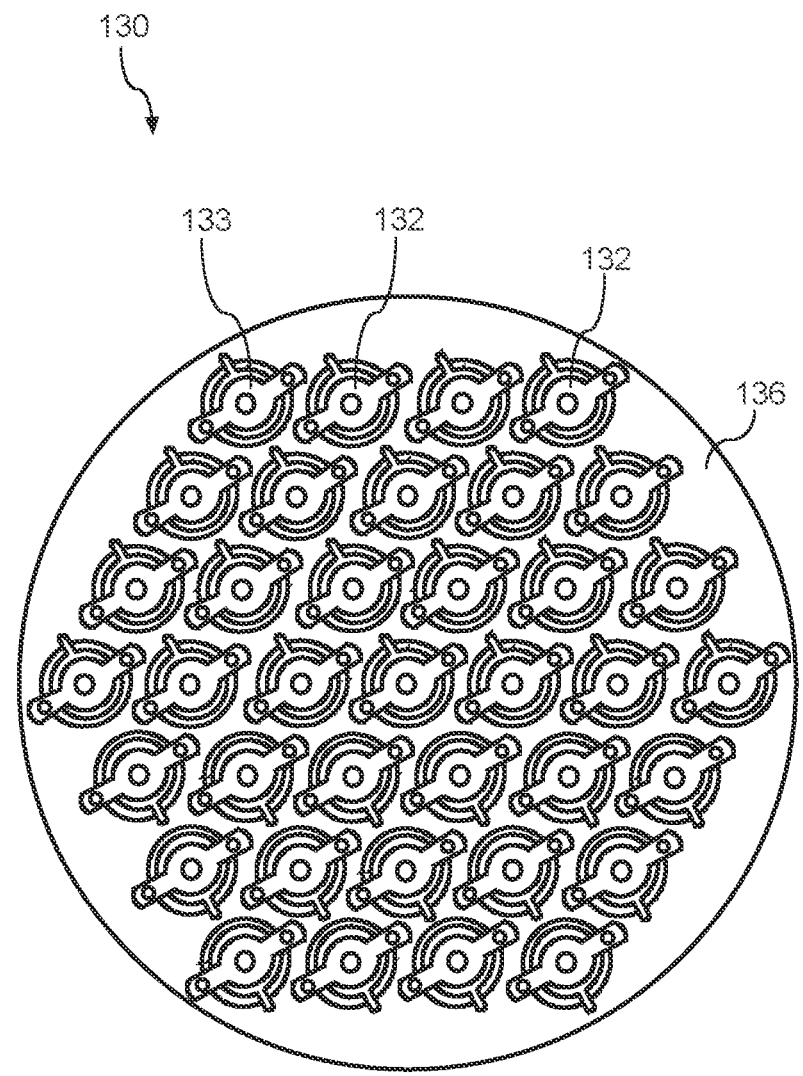
FIG. 2 depicts a top view of an example plasma source array configured to be used in a plasma processing apparatus according to example embodiments of the present disclosure.
Figure 3:
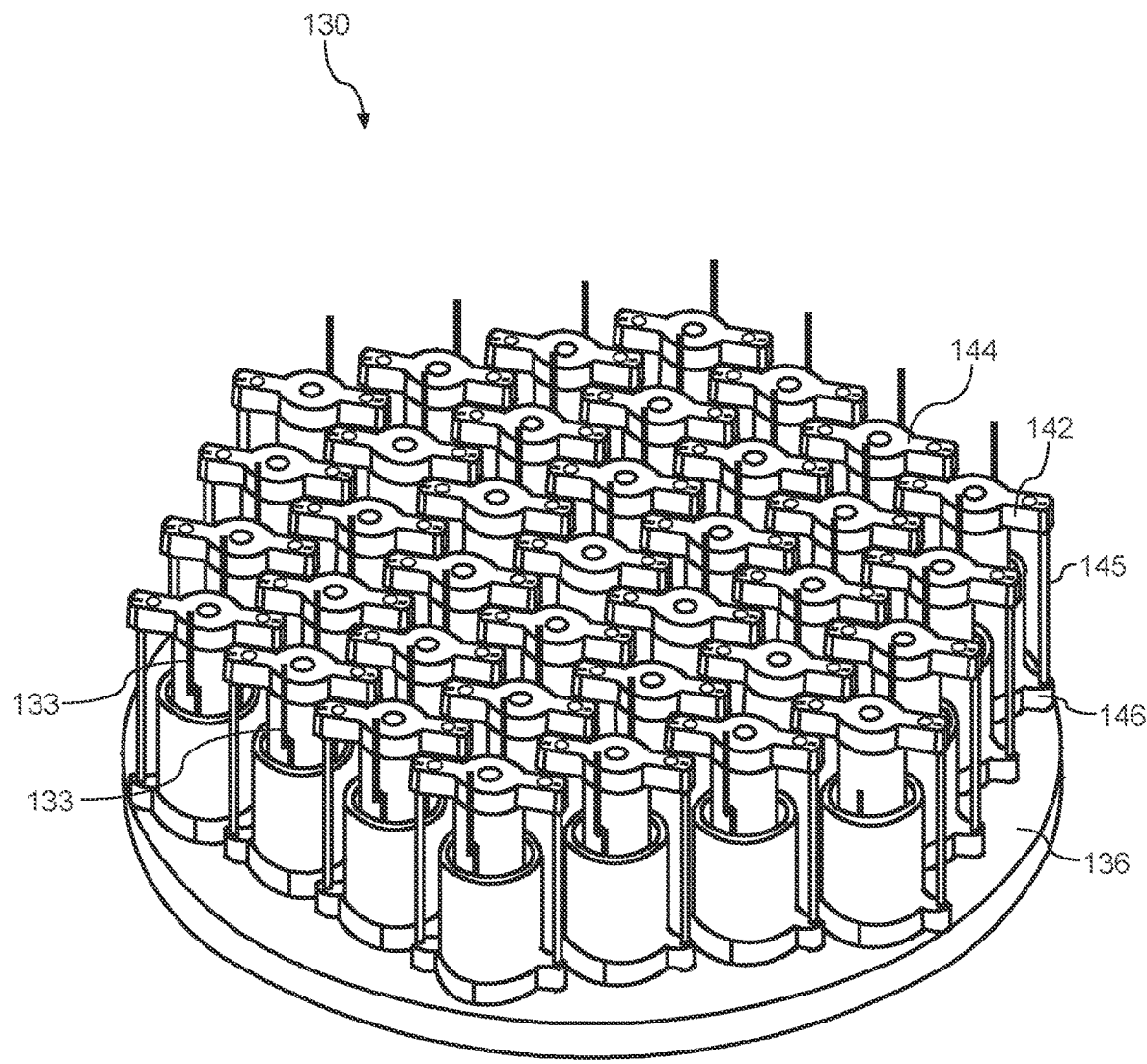
FIG. 3 depicts a perspective view of an example plasma source array configured to be used in a plasma processing apparatus according to example embodiments of the present disclosure.
Figure 4:
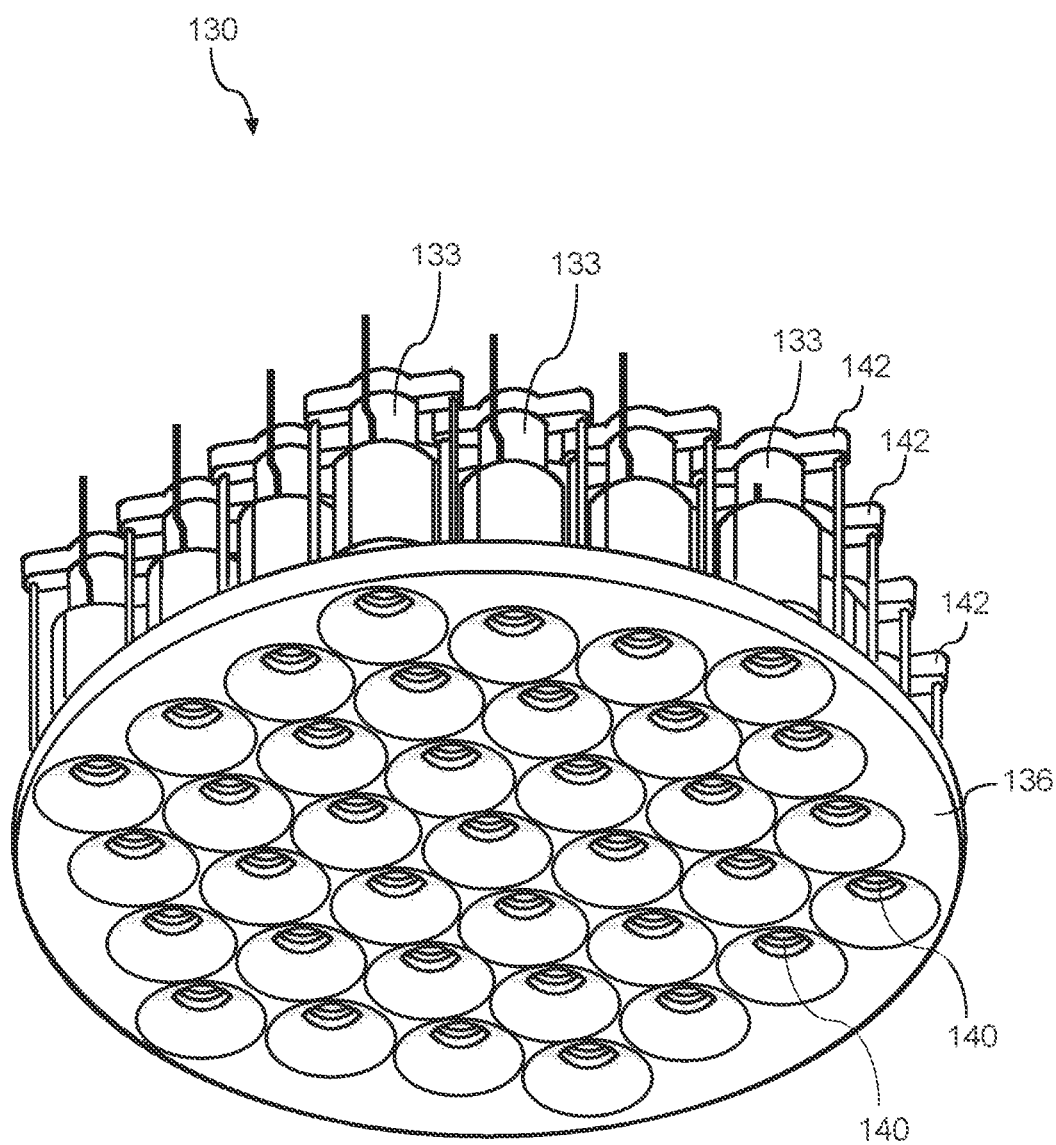
FIG. 4 depicts a perspective view of an example plasma source array configured to be used in a plasma processing apparatus according to example embodiments of the present disclosure.
Figure 5:
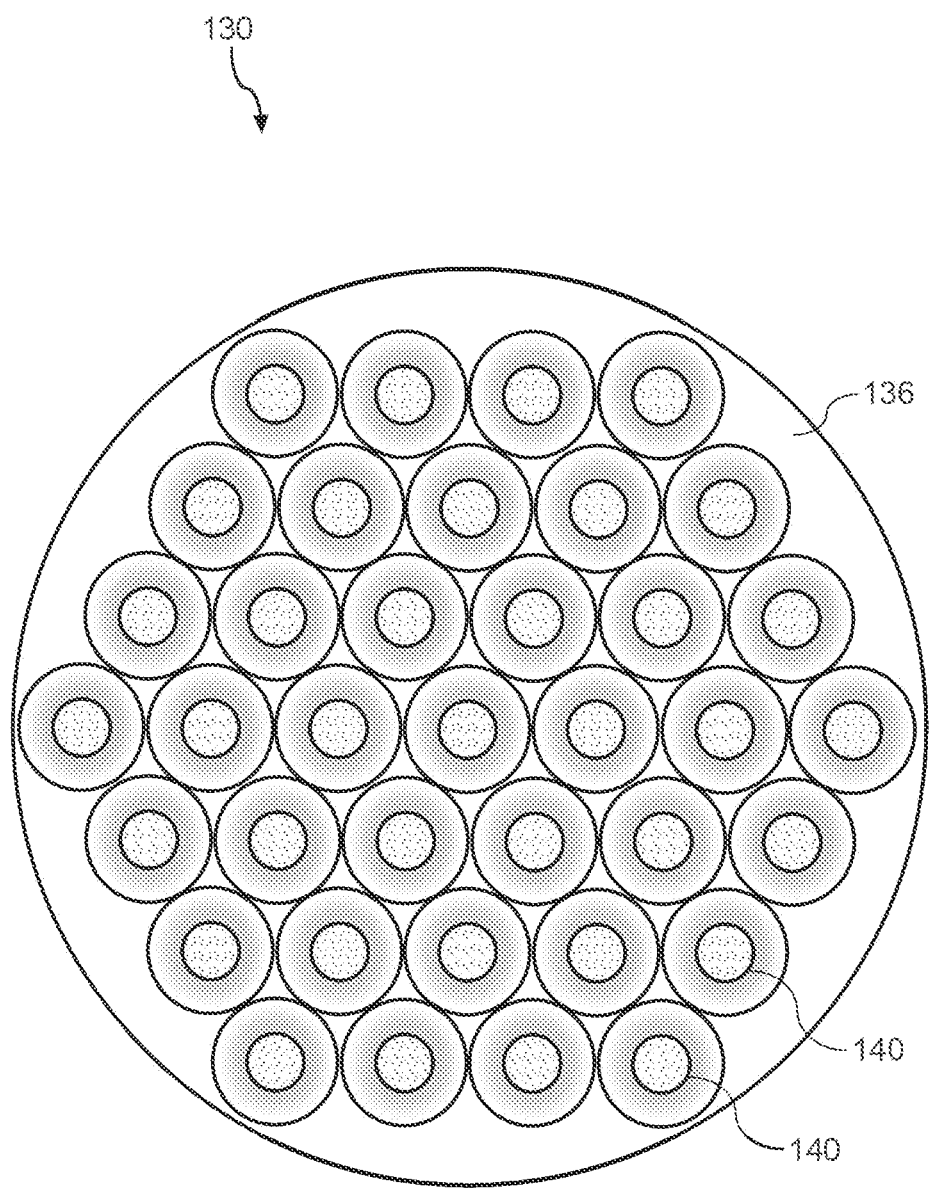
FIG. 5 depicts a bottom view of an example plasma source array configured to be used in a plasma processing apparatus according to example embodiments of the present disclosure.

Example aspects of the present disclosure are directed to a plasma source array that includes a plurality of hybrid plasma sourcelets disposed on a base plate. Each hybrid sourcelet includes a dielectric tube having an inner area and an outer surface; an inductively coupled plasma source for generating a inductively coupled plasma disposed proximate to the outer surface of the dielectric tube; a capacitively coupled plasma source for generating a capacitively coupled plasma disposed within the inner area of the dielectric tube; and a gas injection system configured to supply one or more process gases to the inner area of the dielectric tube. Example plasma processing apparatuses and methods for processing workpieces utilizing such plasma processing apparatuses are also provided.

Existing plasma processing tools may have only two zones for an inductively coupled plasma source to tune uniformity from center to edge. These tools can have non-uniformity with M-shape ion density distribution profile or M-shape etch rate profile from wafer center to wafer edge. In addition, existing two zone inductively coupled plasma sources may not have independent two zone uniformity control since the two-zone ICP coil layout is actually coupled together on the plasma side to form a donut shape in the plasma heating zone, which leads to the M-shape non-uniformity profile.

Example aspects of the present disclosure can provide a solution to uniformity improvement with increased uniformity tunability by using a plurality of plasma sources (e.g., sourcelets) equally spaced or in tailored spatial arrangement in an array. Each plasma source is a hybrid plasma sourcelet including both a capacitively coupled plasma source and an inductively coupled plasma source with relatively small dimensions and large operating window to take advantage of both capacitively coupled plasma and inductively coupled plasma in a single source design. The plasma source array of the present disclosure can be outfitted in a plasma processing apparatus in order to provide a multi-zone hybrid plasma source design that is scalable for any size of plasma processing equipment, such as from 300 mm wafer tools to large processing equipment for display panels and solar panels. The plasma source design can provide for increased uniformity and versatile uniformity tunability.

The array arrangement of a plurality of hybrid plasma sourcelets can provide flexibility in arranging plasma sources in large area with high resolution (w/small sized plasma sources) to improve performance at extreme edge areas of a workpiece for higher yield. The plasma processing apparatus according to example aspects of the present disclosure can be used for semiconductor etch, conductor etch and/or dielectric etch or even other applications like through-silicon via (TSV) and micro-electro mechanical system (MEMS) or even photoresist stripping. Aspects of the present disclosure can provide for precise power control from lower end to high end for each of the hybrid plasma sourcelets. For instance, a small max power of about 55 W for each hybrid plasma sourcelet can have a small dynamic range that helps increase power regulation resolution and thus provides better overall power accuracy regulation for the plasma source array from lower end to upper end in the full power scale. The plasma processing apparatus according to example aspects of the present disclosure can also provide a large RF grounding surface facing the plasma that can help further reduce plasma potential.

Aspects of the present disclosure can have a number of technical effects and benefits. For instance, aspects of the present disclosure can provide increased plasma uniformity and plasma uniformity tunability. The plasma processing apparatus can generate relatively cold downstream plasma for best directed high aspect ratio etch and delicate etch. Additionally, the plasma processing apparatus can reduce capacitive coupling by carefully determining the capacitance of the capacitively coupled plasma section together with operating the RF frequency to keep the voltage from the capacitively coupled plasma electrodes and inductively coupled plasma coils below sputtering thresholds so that the plasma generated is very clean with little to no metal contamination or particles. Additionally, the plasma processing apparatus has a large operating window given that the plasma source array can take advantage of both capacitively coupled plasma generation, which has a large striking window, and inductively coupled plasma generation that is able to generate plasmas with high ionization efficiency. Further, the plasma processing apparatus provides for improved convenience and flexibility given that the hybrid plasma sources can be arranged in a larger area with high resolution in order to improve performance of the apparatus and further, to improve overall uniformity during processing.

Aspects of the present disclosure are discussed with reference to plasma etch applications. However, example aspects of the present disclosure can be used with other applications without deviating from the scope of the present disclosure, such as chemical vapor deposition (CVD), plasma vapor deposition (PVD), high-density plasma chemical-vapor deposition (HDPCVD), plasma-enhanced chemical-vapor deposition (PECVD), atomic layer deposition (ALD), atomic layer etch (ALE), etc. or even large display panel or solar panel fabrication.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece, such as a flat panel display, solar panel, etc. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

FIG. 1 depicts an example plasma processing apparatus 100 according to example aspects of the present disclosure. As shown, the apparatus includes a processing chamber. The processing chamber can include a workpiece support 112 or a pedestal. A workpiece 114 can be placed on the workpiece support 112. A plasma source array 130 according to example aspects of the present disclosure can be used to generate a plasma and/or species from a process gas for exposure to the workpiece 114. The plasma source array 130 can include one or more (e.g., a plurality) of hybrid plasma sourcelets 133. The plasma source array 130 is coupled to an RF power generator 134 through a suitable matching network 132. The plasma source array 130 can be formed of any suitable material, including conductive materials suitable for inducing plasma within the processing chamber 110. Process gases can be provided to the plasma source array 130 from gas supply 150 and annular gas distribution channel 151 or other suitable gas introduction mechanism. When the plasma source array 130 is energized with RF power from the RF power generator 134, a plasma can be generated in the processing chamber 110. In a particular embodiment, the plasma processing apparatus 100 can include an optional grounded Faraday shield 128 to reduce capacitive coupling of the plasma source array 130 to the plasma. The grounded Faraday shield 128 can be formed of any suitable material or conductor, including materials similar or substantially similar to the plasma source array 130.

As shown in FIG. 1, according to example aspects of the present disclosure, the apparatus 100 can include a gas delivery system 155 configured to deliver process gas to the plasma source array 130. Optionally, the gas delivery system 155 can also be configured to deliver process gas to the processing chamber 110. For instance, a gas distribution channel 151 or other distribution system can be utilized to provide. The gas delivery system 155 can include a plurality of feed gas lines 159. The feed gas lines 159 can be controlled using valves 158 and/or gas flow controllers 185 to deliver a desired amount of gases into the plasma chamber 120 as process gas. The gas delivery system 155 can be used for the delivery of any suitable process gas. Example process gases include, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma source array 130 and/or processing chamber 110. In embodiments, the gas delivery system 155 can be controlled with a gas flow controller 185.

The apparatus 100 can include a bias source having a bias electrode 510 in the workpiece support 112. The bias electrode 510 can be coupled to an RF power generator 514 via a suitable matching network 512. When the bias electrode 510 is energized with RF energy, a plasma 504 can be generated from a process gas or process gas mixture in the processing chamber 110 for direct exposure to the workpiece 114. The processing chamber 110 can include a gas exhaust port 516 for evacuating a gas from the processing chamber 110. Application of RF power to the bias electrode 510 allows the bias electrode 510 to act as a bias source. The workpiece support can be movable in a vertical direction. For instance, the workpiece support 112 can include a vertical lift that can be configured to adjust a distance between the workpiece support 112 and the plasma source array 130. For instance, the vertical lift can be configured to move the workpiece support 112 and workpiece 114 thereon closer to the plasma source array 130 during processing of the workpiece 114.

Optionally, a separation grid 200 can be provided between the processing chamber 110 and the plasma source array 130. The separation grid 200 can be used to perform ion filtering from plasma generated by the plasma source array 130 as it is delivered into the processing chamber 110. For example, the plasma generated by the plasma source array 130 can be filtered by the separation grid 200 in order to generate a filtered mixture in the processing chamber 110. The filtered mixture including one or more species can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

The apparatus 100 can include a controller 175. The controller 175 controls various components in processing chamber 110 to direct processing of workpiece 114. For example, controller 175 can be used to the plasma source array 130 and/or gas delivery system 155. The controller 175 can also implement one or more process parameters, such as controlling the gas flow controllers 185 and altering conditions of the processing chamber 110 in order to maintain suitable conditions in the processing chamber 110 during processing of the workpiece 114. The controller 175 can include, for instance, one or more processors and one or more memory devices. The one or more memory devices can store computer-readable instructions that, when executed by the one or more processors, cause the one or more processors to perform operations, such as any of the control operations described herein. In certain embodiments, the controller 175 can be configured to adjust power supply to the plasma source array 130, for example, by adjusting the power supplied to one or more of the hybrid plasma sourcelets 133. In other embodiments, the controller can be configured to adjust the gas delivery system to supply one or more process gases to one or more of the hybrid plasma sourcelets 133. For example, the controller 175 can modify (e.g., increase or decrease) or stop gas flow to certain of the hybrid plasma sourcelets 133. Further, the controller 175 can modify the type and amount of process gas supplied to each of the hybrid plasma sourcelets 133.

FIGS. 2-7 depict aspects of a plasma source array 130 according to example aspects of the present disclosure. As shown, the plasma source array 130 includes a plurality of hybrid plasma sourcelets 133 disposed on a base plate 136. Each hybrid plasma sourcelet 133 can have diameter that is much smaller than a diameter of the base plate 136 or processing chamber. For example, in embodiments the base plate 136 includes an overall base plate footprint and each individual hybrid plasma sourcelet 133 includes a sourcelet footprint. The sourcelet footprint is less than 40% of the base plate footprint, such as less than 30% of the base plate footprint, such as less than 20% of the base plate footprint, such as less than 10% of the base plate footprint, such as less than 5% of the base plate footprint.

One or more brackets 142 can be configured to secure each hybrid plasma sourcelet 133 to the base plate 136. As shown, in certain embodiments, the bracket 142 can include a top portion 144 and a bottom portion 146 that can be securely coupled by one or more pins 145 or rods. The top portion 144 of the bracket can be provided around a top portion of the hybrid plasma sourcelet 133 in order to provide stability thereto, while the bottom portion 146 of the bracket 142 provides stability to the bottom portion of the hybrid plasma sourcelet 133 and also securely couples the sourcelet 133 to the base plate 136. As shown, one or more pins 145, such as at least two pins, are utilized to secure the bracket 142. However, the disclosure is not so limited, indeed, the brackets 142 can be secured via at least three pins, such as at least four pins, such as at least five pins, etc. in order to secure the hybrid plasma sourcelet 133 to the base plate 136. Further, the bottom portion 146 of the bracket 142 can be configured with one or more connection points for securely coupling the bracket 142 to the base plate 136. For example, the bracket 142 can be secured to the base plate 136 via at least one connection point, such as at least two connection points, such as at least three connection points, such as at least four connection points, such as at least five connection points, etc.

Each of the hybrid plasma sourcelets 133 can be individually adjusted for their output RF power to tune process uniformity. Each hybrid plasma sourcelet 133 has a hybrid design that combines a CCP portion and an ICP portion in one source. The CCP portion helps open up the striking or ignition window, while the ICP portion can be used to generate most of the plasma. The diameter of the base plate 136 can be selected depending on processing needs. For example, in certain embodiments the base plate 136 can have a diameter of from about 500 mm to about 600 mm, such as about 550 mm to about 580 mm. The base plate 136 can be formed from any suitable material including a dielectric material or a metal material. The base plate 136 can be coated with a suitable coating material, including a yttria-based coating. In certain embodiments, the base plate 136 can be outfitted with one or more systems capable of controlling the temperature of the baseplate, especially during processing. For example, the base plate 136 can be temperature controlled with anodization. As shown more particularly in FIGS. 4-5 the base plate 136 includes one or more apertures 140 over which one or more hybrid plasma sourcelets 133 can be disposed. The apertures 140 allow for plasma generated by each of the one or more hybrid plasma sourcelets 133 to flow into the processing chamber 110 for processing the workpiece 114.

More specifically, FIGS. 2-5 show an example of 37 hybrid plasma sourcelets 133 equally spaced in an about a 21 inch diameter (533 mm) on the base plate 136. However, the disclosure is not so limited. Indeed, the base plate 136 can include at least 5 hybrid plasma sourcelets 133 up to about 45 hybrid plasma sourcelets. The workpiece 114 to be processed is located below the base plate 136 with a spacing somewhere from about 3 in (76 mm) to about 7 in (178 mm). By adjusting the RF power for each of the 37 hybrid plasma sourcelets 133 individually, the uniformity tunability can be greatly improved comparing to existing plasma source designs for semiconductor plasma process.

FIGS. 8A-8D show the details of an example hybrid plasma sourcelet 133 according to example embodiments of the present disclosure. As shown, the sourcelet 133 can include a dielectric tube 170 defining an inner area 172 and having an outer surface 171. The dielectric tube 170 can be formed from any suitable dielectric material, including, but not limited to quartz and/or ceramic. The dielectric tube 170 can be coupled to the bracket 142 for securing the sourcelet 133 to the base plate 136. For example, the top portion or a top surface of the dielectric tube 170 can be coupled to the top portion 144 of the bracket 142. Optionally, the bottom portion or bottom surface of the dielectric tube 170 can be coupled to the bottom portion 146 of the bracket 142. The diameter of the dielectric tube 170 can range from about 10 mm to about 500 mm, such as from about 20 mm to about 450 mm, such as from about 30 mm to about 400 mm, such as from about 40 mm to about 350 mm, such as from about 50 mm to about 300 mm, such as from about 60 mm to about 250 mm, such as from abut 70 mm to about 200 mm. In certain embodiments, the dielectric tube has a diameter of from about 10 mm to about 40 mm.

The hybrid plasma sourcelet 133 can include an inductively coupled plasma source 180 for generating an inductively coupled plasma. As shown, the inductively coupled plasma source 180 can include an induction coil 182 that is disposed around the outer surface 171 of the dielectric tube 170. The portion of the sourcelet 133 having the inductively coupled plasma source 180 can be referred to as the ICP portion of the hybrid plasma sourcelet 133. A plasma can be generated within the tube 170 when the induction coil 182 is energized with RF energy. An RF feed 184 to provide RF energy from a suitable RF energy source can be coupled to the induction coil 182 to supply RF power for inducing plasma in the sourcelet 133. In certain embodiments, the induction coil 182 is wrapped around a portion of the tube 170 and does not extend along the entire length of the tube. For example, in certain embodiments, the induction coil is wrapped around at least 10%, such as at least 20%, such as at least 30%, such as at least 40%, such as at least 50%, such as at least 60%, such as at least 70% of the outer surface 171 of the dielectric tube 170. In certain embodiments, the bottom portion of the dielectric tube 170 having the induction coil 182 disposed thereabout has a height in the z-direction of from about 10 mm to about 100 mm, such as from about 20 mm to about 90 mm, such as from about 30 mm to about 80 mm, such as from about 40 mm to about 70 mm. In certain embodiments, the bottom portion of the tube 170 has a height of about 65 mm. Further, the bottom portion of the dielectric tube 170 can include the total portion of the tube 170 around which the induction coil 182 is wound.

The sourcelet 133 includes a shield 186 disposed around an outer perimeter of the dielectric tube surrounding the induction coil 182. The shield 186 can include any suitable material including a ferrite material. The shield is configured to prevent cross-talk between multiple hybrid plasma sourcelets 133 disposed on the base plate 136.

The hybrid plasma sourcelet 133 is configured with a capacitively coupled plasma source 190 for generating a capacitively coupled plasma. The capacitively coupled plasma source 190 can include one or more electrodes 192, 194 disposed within the inner area 172 of the dielectric tube 170. The electrodes 192, 194 can be arranged in any suitable manner. In certain embodiments, the electrodes 192, 194 are arranged as concentric coils in an annular manner within the inner area 172 of the dielectric tube. The capacitively coupled plasma source 190 can be supplied with RF, DC, and/or AC power in order to generate a capacitively coupled plasma within the dielectric tube 170. For example, at least one of the electrodes 192, 194 can be coupled to an RF source with the other electrode coupled to ground or other reference. A plasma can be generated when at least one of the electrodes 192, 194 is energized with RF energy.

Figure 9:
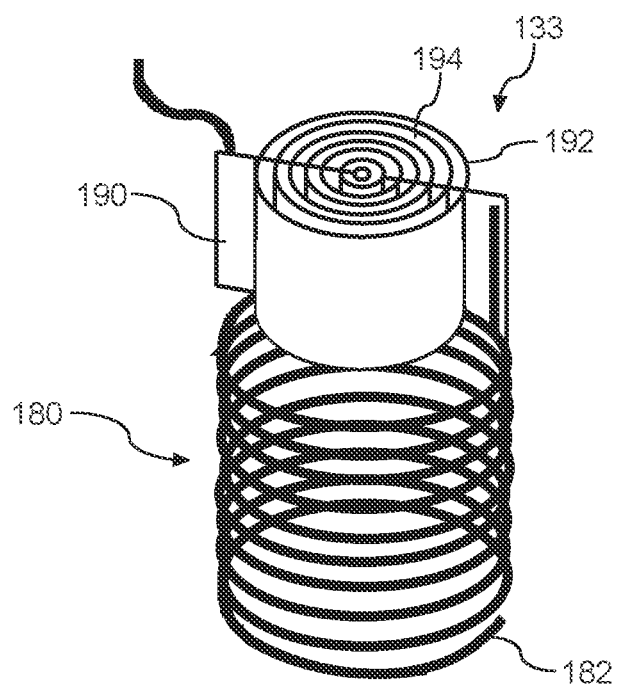
FIG. 9 depicts an example capacitively coupled plasma source and an example inductively coupled plasma source to be used in a hybrid plasma sourcelet according to example embodiments of the present disclosure.
Figure 10:
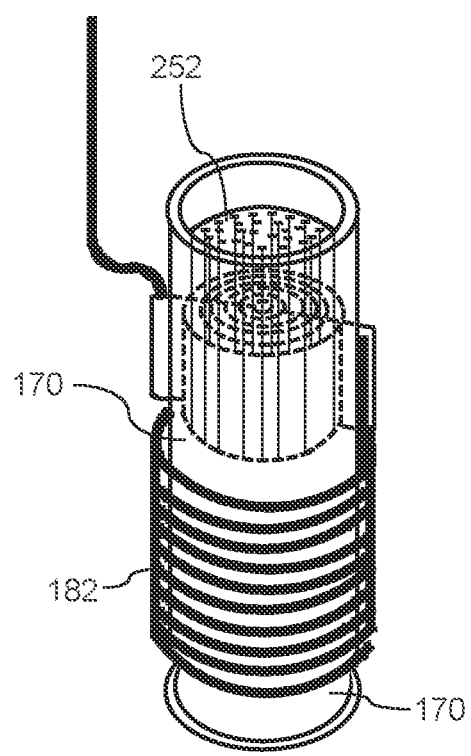
FIG. 10 depicts an example hybrid plasma sourcelet including an example gas distribution plate according to example embodiments of the present disclosure.
Figure 11:
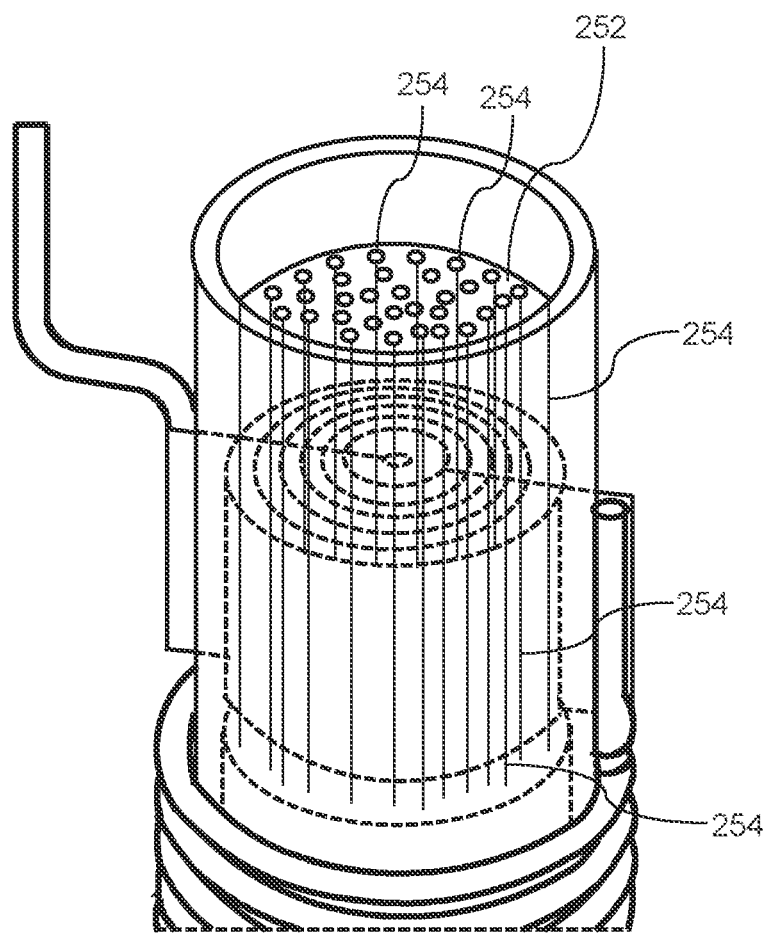
FIG. 11 depicts an example hybrid plasma sourcelet including an example gas distribution plate according to example embodiments of the present disclosure.
Figure 12:
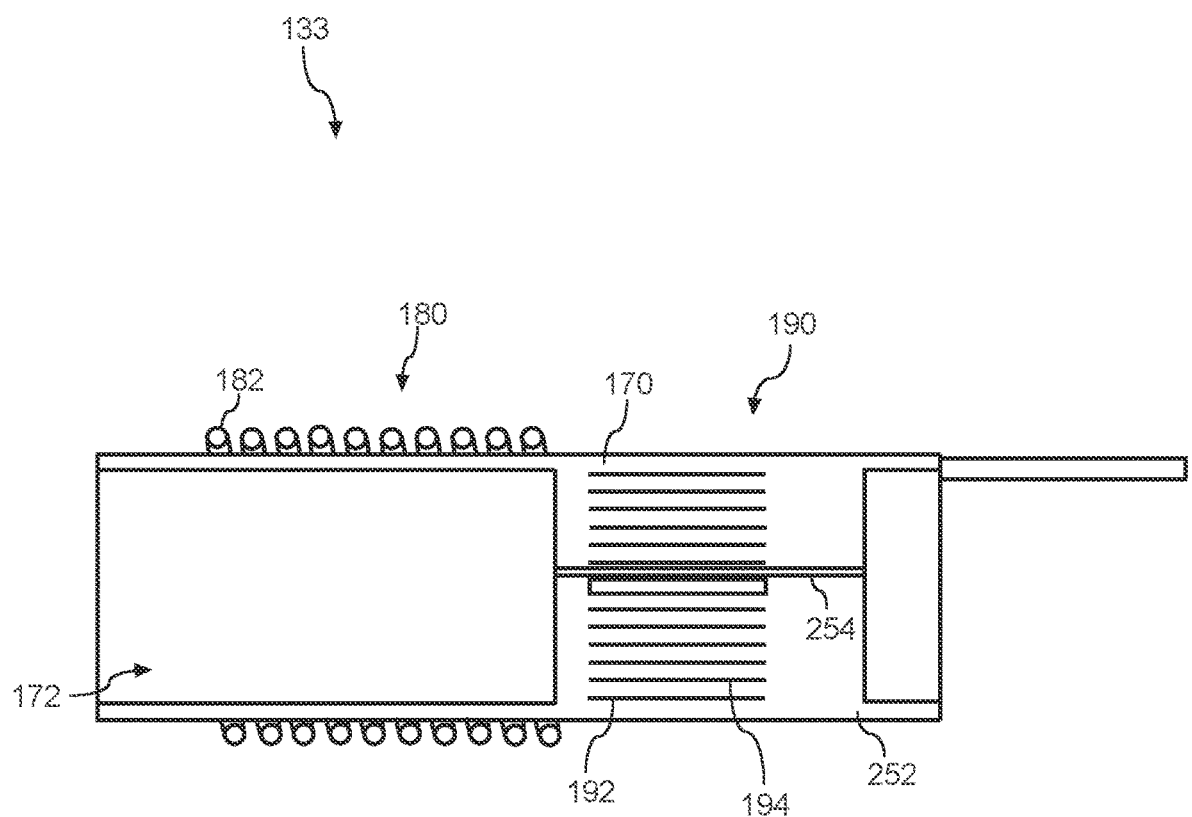
FIG. 12 depicts a cross-sectional view of an example hybrid plasma sourcelet according to example embodiments of the present disclosure.
Figure 13:
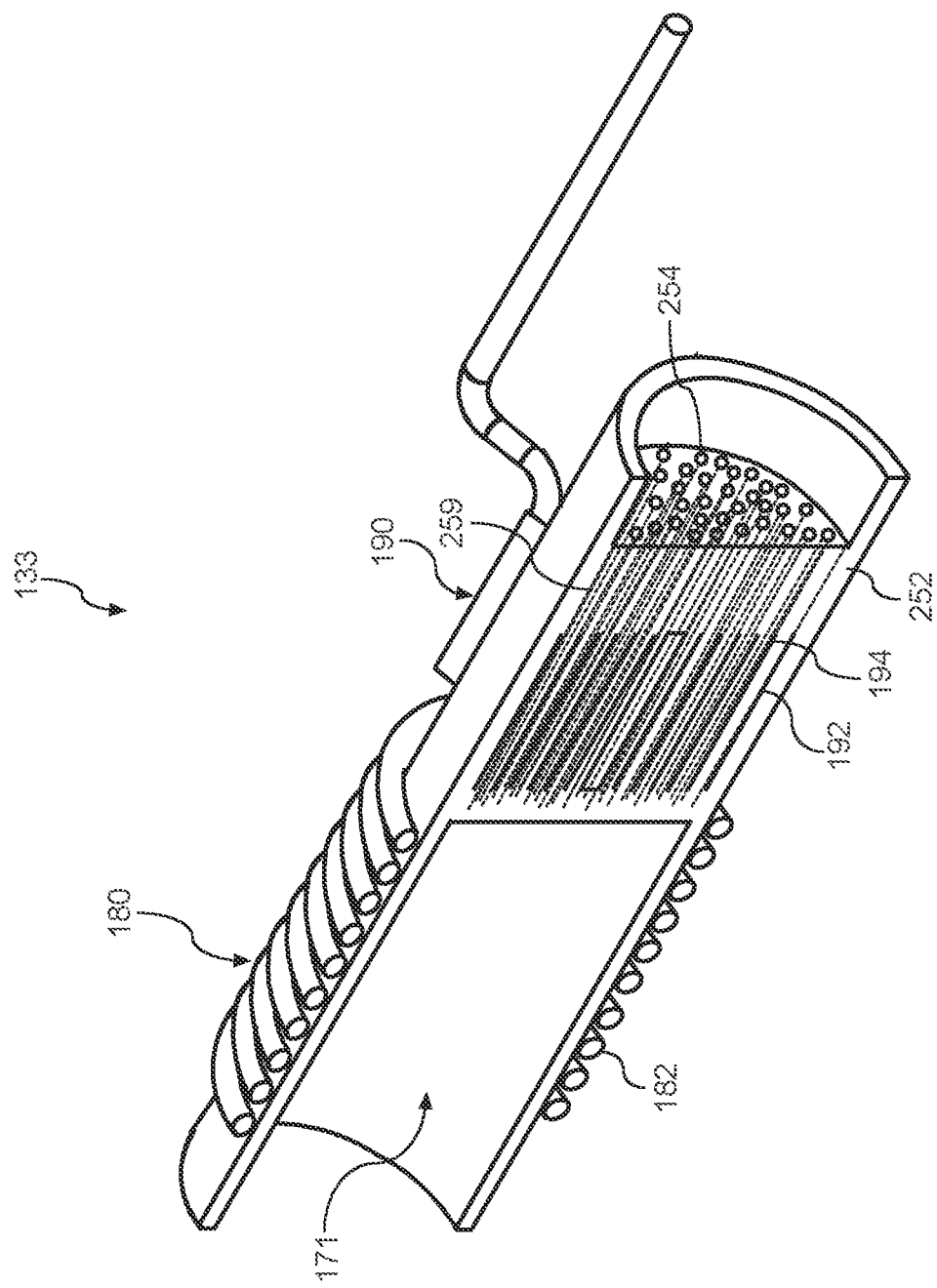
FIG. 13 depicts a cross-sectional view of an example hybrid plasma sourcelet according to example embodiments of the present disclosure.

In certain embodiments, the capacitively coupled plasma source 190 is disposed above the inductively coupled plasma source 180 in the Z-direction. For example, FIG. 9 illustrates placement of the electrodes 192, 194 and the induction coil 182. In such embodiments, suitable power can be supplied to both the capacitively coupled plasma source 190 and the inductively coupled plasma source 180. As gas is supplied to the hybrid plasma sourcelet 133 the capacitively coupled plasma source 190 is configured to help ignite and/or facilitate striking of the plasma while the inductively coupled plasma source 180 can facilitate plasma generation within a portion of the inner area 172 of the dielectric tube 170.

Process gas can be supplied to the hybrid plasma sourcelet 133 via an suitable gas distribution system. For example, one or more gas feed lines can be provided to each hybrid plasma sourcelet 133. Accordingly, in certain embodiments, each plasma sourcelet 133 has its own gas feed line that can be individually connected to gas supply system 155 in order to provide the desired process gas to the sourcelet. In certain other embodiments, sections of hybrid plasma sourcelets 133 can be supplied with process gas from a single gas distribution system while other sections of hybrid plasma sourcelets 133 can be supplied with process gas from a different single gas distribution system. Accordingly, single or multiple gas distribution systems can be utilized to supply process gas to the hybrid plasma sourcelets 133.

Referring to FIGS. 10-13, the hybrid plasma sourcelets 133 include a gas distribution plate 252 for facilitating the flow of process gas through the hybrid plasma sourcelet 133. For example, the gas distribution plate 252 can be located within the inner area 172 of the dielectric tube 170. The gas distribution plate 252 can be outfitted with one or more holes or channels for routing process gas through at least a portion of the dielectric tube 170. For example, in certain embodiments, the gas distribution plate 252 includes one or more channels 254 disposed between one or more electrodes 192,194 of the capacitively coupled plasma source 190. The channels 154 are configured to provide process gas from a top portion of the sourcelet 133 through the capacitively coupled plasma source 190 to a bottom portion of the sourcelet 133. For example, the channels 254 can provide gas through the electrodes 192,194 and deliver the gas to a portion of the dielectric tube surrounded by the inductively coupled plasma source 180.

Figure 14:
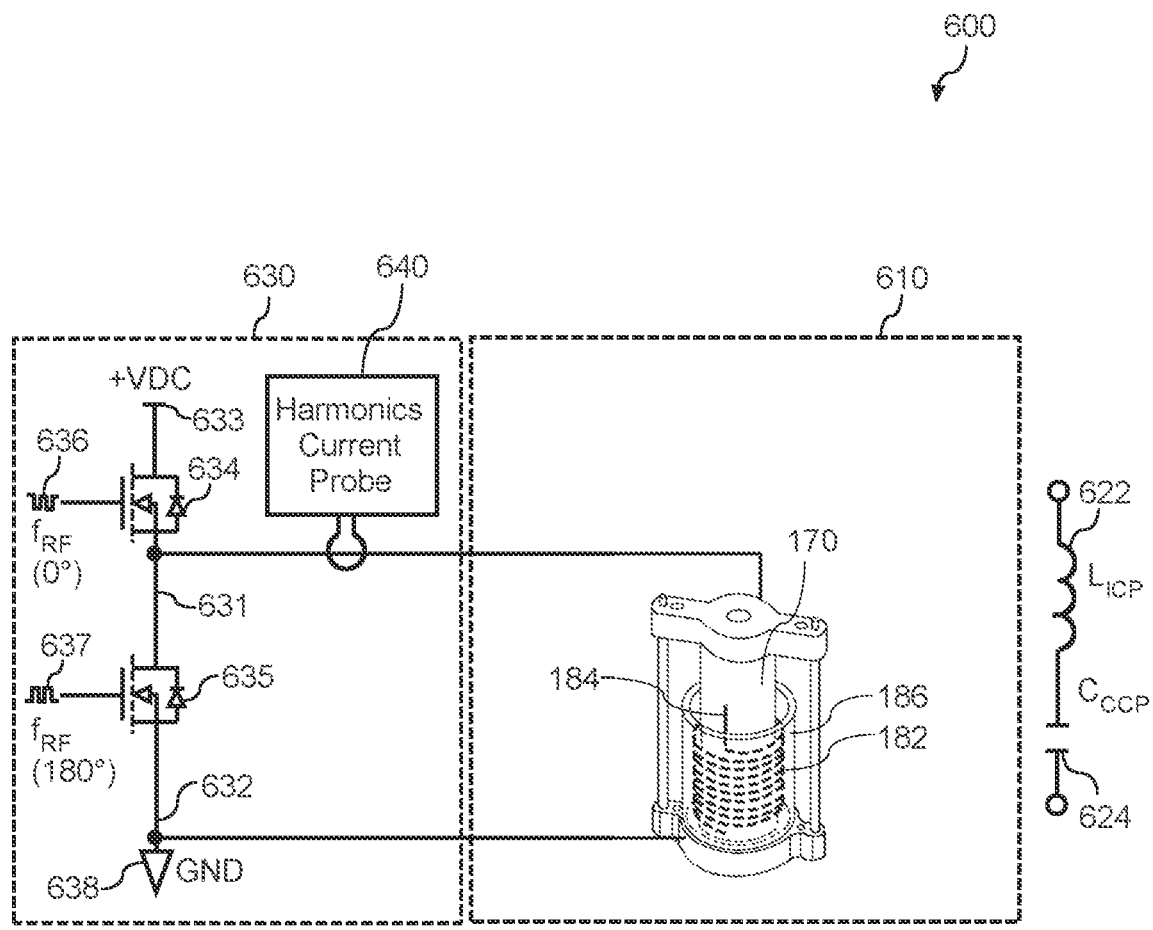
FIG. 14 depicts an example RF drive for hybrid plasma sourcelets to be used in a plasma source array according to example embodiments of the present disclosure.

FIG. 14 depicts an example RF drive for each hybrid plasma sourcelet 133 according to example aspects of the present disclosure. Each hybrid plasma sourcelet 133 can be coupled to its own unique RF drive. Alternatively, multiple hybrid plasma sourcelets 133 can be coupled to the same RF drive. The RF drive can be implemented without a matching network. The RF operating frequency of the direct drive generator can be adjustably tuned to effect increased and/or maximum power transfer to the plasma source.

Referring more particularly to FIG. 14, an example hybrid plasma source 600 can include a resonant circuit 610 that includes an inductively coupled plasma (ICP) source 612 and a capacitively coupled plasma (CCP) source 614. The ICP source 612 provides an inductive component for resonant circuit 610 and CCP source 614 provides a capacitive component for resonant circuit 610. In some implementations, such as depicted in FIG. 14, ICP source 612 is connected in series with CCP source 614. Although the present disclosure refers to a resonant circuit 610, it should be appreciated that a resonant circuit may also be referred to as an LC circuit, a tank circuit, a tuned circuit, or other circuit known to include an inductor (represented by letter L) and capacitor (represented by letter C) connected together. Resonant circuit schematic 620 provides a schematic representation of the source components within resonant circuit 610. More specifically, the ICP source 612 of resonant circuit 610 provides an inductance ($L_{ICP}$) 622 of resonant circuit schematic 620 and the CCP source 614 of resonant circuit 610 provides a capacitance ($C_{CCP}$) 624 of resonant circuit schematic 620.

Hybrid plasma source 600 can also include a controller 630. In some implementations, controller 630 can be configured to control operation of the ICP source 612 and the CCP source 614 such that the ICP source 612 and the CCP source 614 form a resonant circuit 610. More particularly, controller 630 can help ensure that the RF operating frequency of resonant circuit 610 is adjusted such that the resonant circuit 610 resonates at a desired excitation frequency. When operating conditions change in a plasma chamber employing hybrid plasma source 600, controller 630 can help automatically tune the operating frequency of resonant circuit 610 to track the chamber conditions in order to dynamically maintain series resonance so that RF power can be beneficially delivered to the plasma chamber at full capacity.

In one implementation of the disclosed technology, controller 630 of hybrid plasma source 600 can include a current sensor 640 coupled to the resonant circuit 610 and configured to measure harmonic components of the RF current generated by the resonant circuit 610. In some implementations, current sensor 640 can correspond to a VI probe. Current sensor 640 can be configured to measure only harmonic components of the RF current and not a fundamental component of the RF current generated by the resonant circuit 610. For example, an RF current generated by resonant circuit 610 can include a fundamental current component and a harmonic current component. The fundamental current component can correspond to the portion of RF current attributed to an excitation frequency, or resonant frequency, of the resonant circuit 610. The harmonic current component can be a sum or one or more currents respectively corresponding to one or more harmonics of the excitation frequency. Controller 630 in conjunction with current sensor 640 can be configured to directly measure the harmonic current component of the RF current generated by resonant circuit 610, and to control the excitation frequency by reducing a magnitude of the harmonic current below a target value. For example, aspects of the first RF clock signal 636, aspects of the second RF clock signal 637, or additional aspects of controller 630 (e.g., variable capacitors as described in later embodiments) can be selectively tuned to dynamically adjust the operating frequency of resonant circuit 610 for peak performance. Reducing or minimizing the harmonic current component can help to optimize series resonance and yield full capacitor performance for hybrid plasma source 600.

Referring still to FIG. 14, controller 630 can include a matchless direct drive RF circuit that includes a first terminal 631 connected to the ICP source 612 and a second terminal 632 connected to the CCP source 614. RF power generated by resonant circuit 610 can be delivered to an RF source component 633 for a plasma processing apparatus. Controller 630 can include a first transistor 634 and second transistor 635 that can respectively correspond, for example, to field effect transistors such as MOSFETS. First transistor 634 can be provided between first terminal 631 and RF source component 633, while a second transistor 635 can be provided between first terminal 631 and second terminal 632, which is connected to ground 638. First terminal 631 is positioned between a drain terminal of second transistor 635 and a source terminal of first transistor 634, while second terminal 632 is connected to a source terminal of second transistor 635. First transistor 634 can be configured to receive a first RF signal 636 at its gate terminal, while second transistor 635 can be configured to receive a second RF signal 637 at its gate terminal. In some implementations, first RF signal 636 and second RF signal 637 are pulsed RF clock signals. In some implementations, first RF signal 636 and second RF signal 637 are square wave signals characterized by a pulsing frequency of $f_{RF}$. In some implementations, first RF signal 636 is shifted in phase relative to second RF signal 637. For instance, first RF signal 636 can be shifted from second RF signal 637 by about 180 degrees, thus being characterized by substantially opposite signal phase. A drain terminal of first transistor 634 can deliver power to RF source 633.

Figure 6:
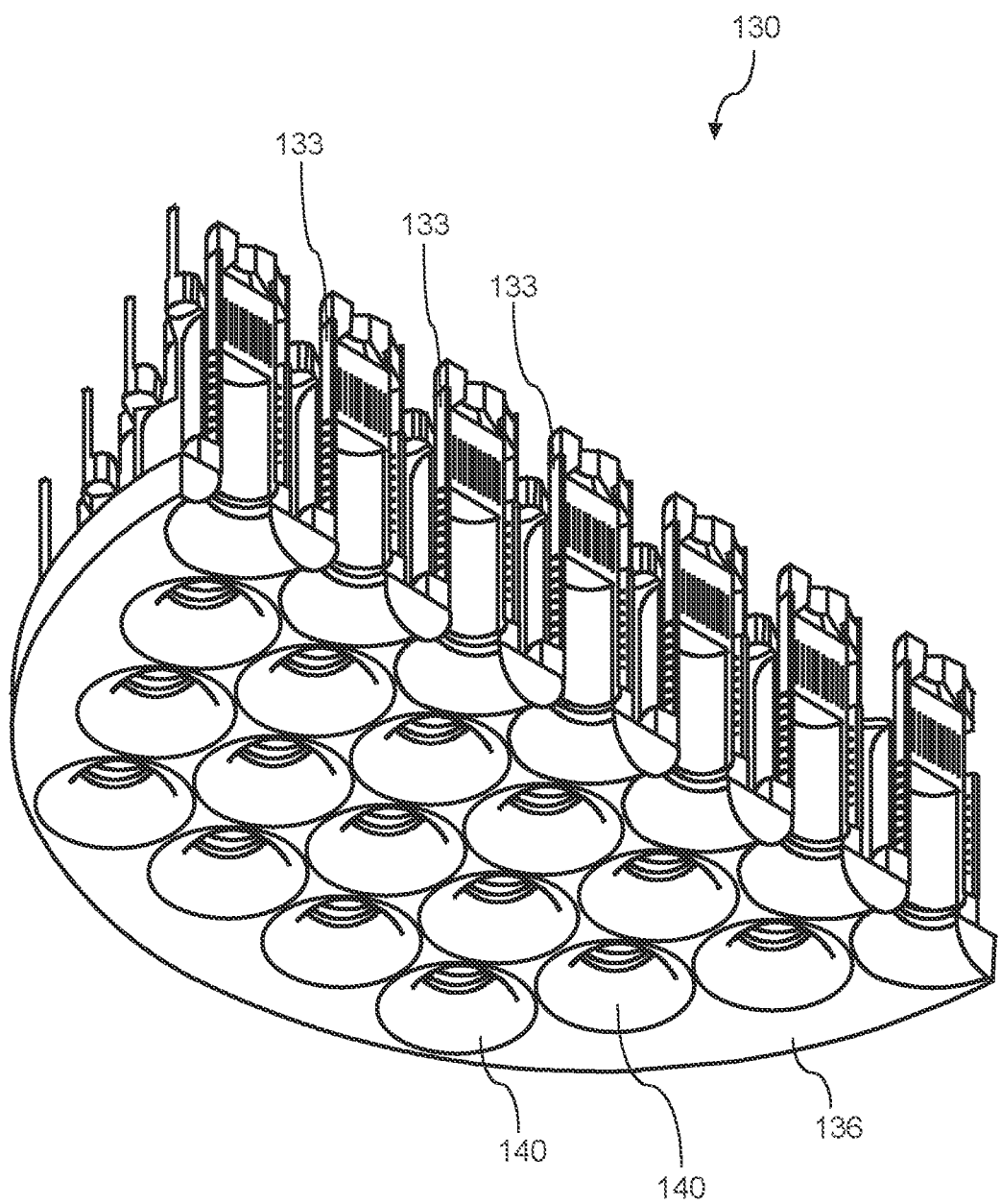
FIG. 6 depicts a perspective cross sectional view of an example plasma source array configured to be used in a plasma processing apparatus according to example embodiments of the present disclosure.
Figure 7:
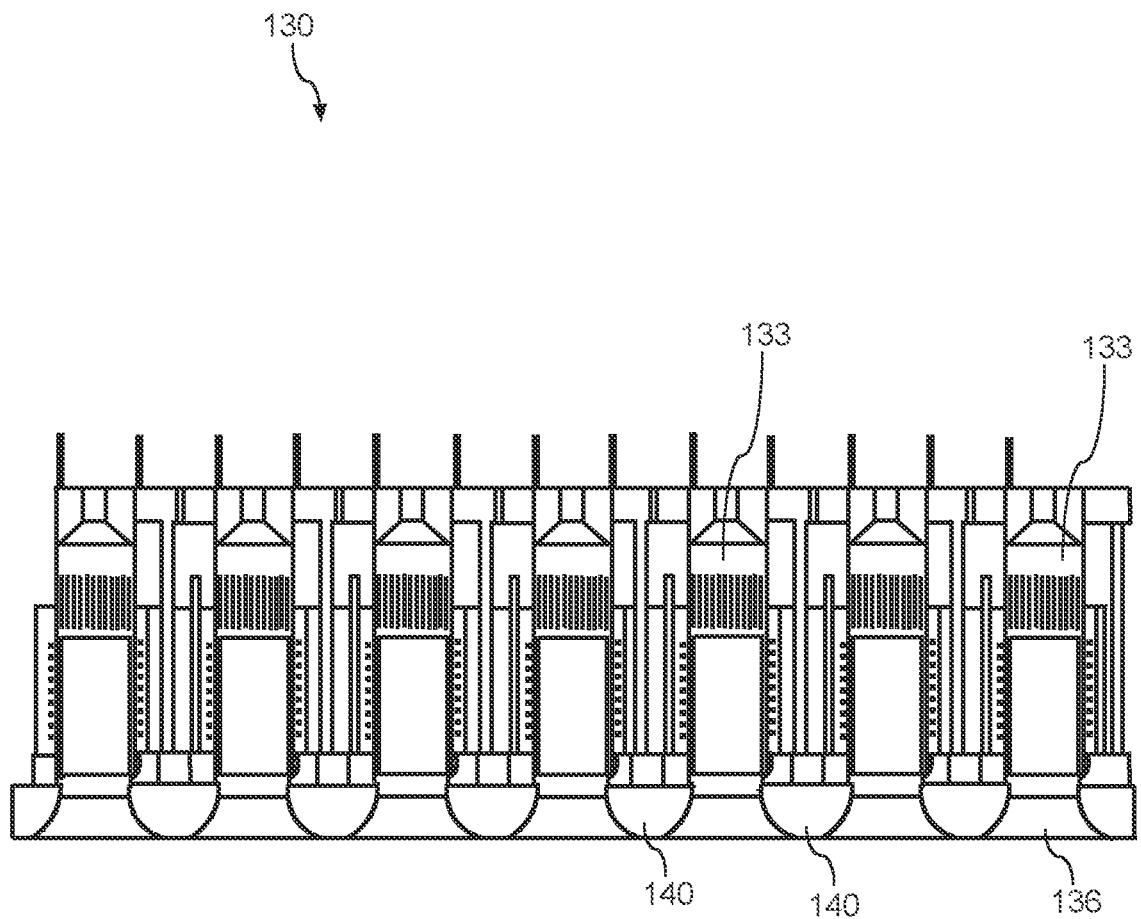
FIG. 7 depicts a cross sectional view of an example plasma source array configured to be used in a plasma processing apparatus according to example embodiments of the present disclosure.
Figure 8A:
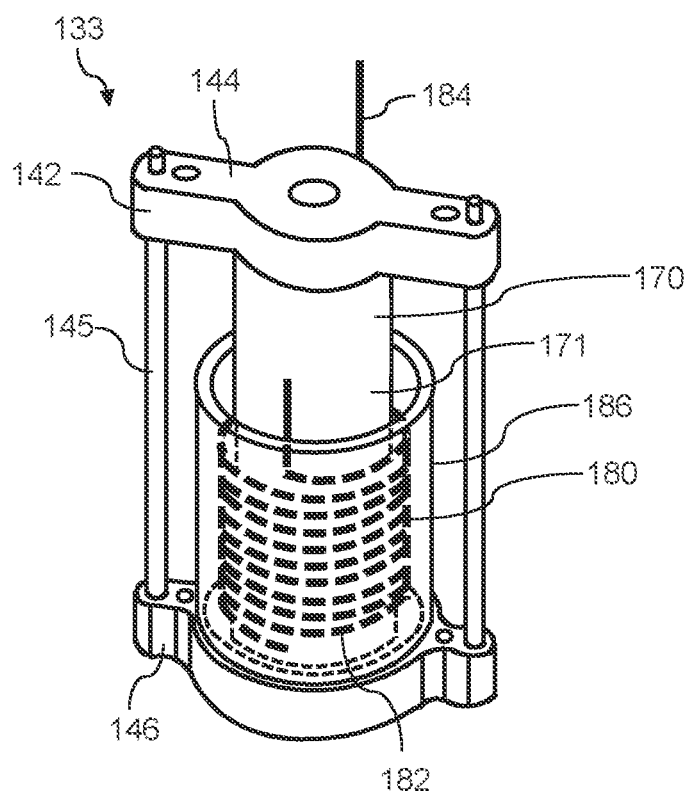
FIG. 8A depicts an example hybrid plasma sourcelet according to example embodiments of the present disclosure.
Figure 8B:
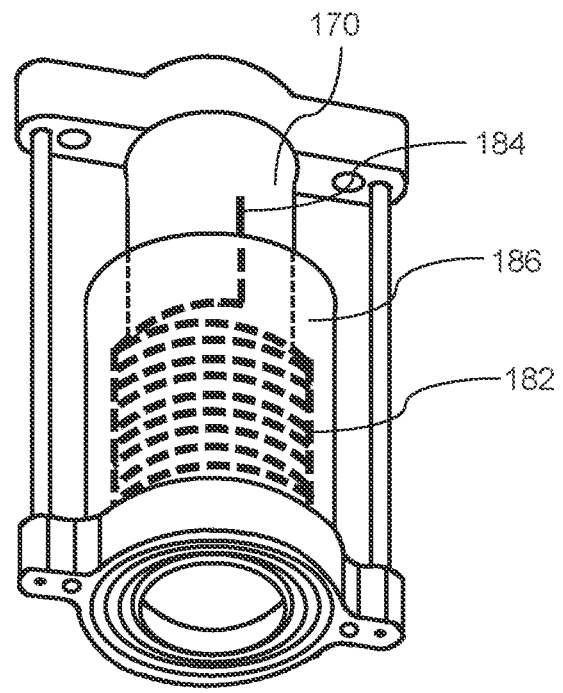
FIG. 8B depicts an example hybrid plasma sourcelet according to example embodiments of the present disclosure.
Figure 8C:
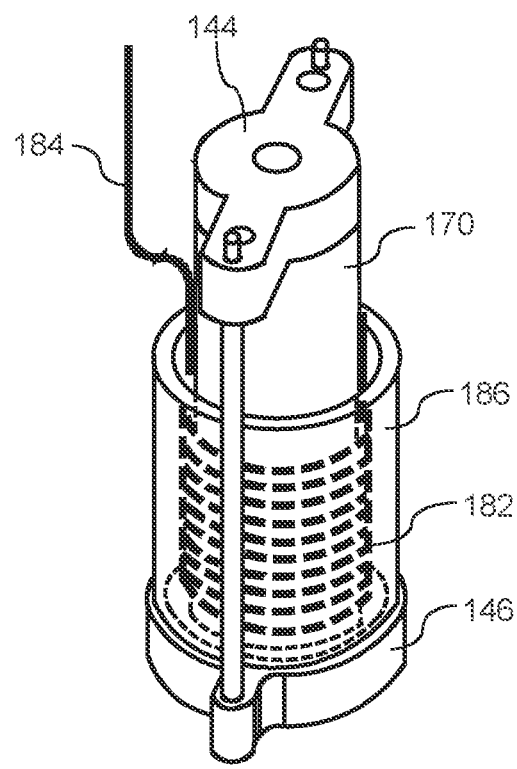
FIG. 8C depicts an example hybrid plasma sourcelet according to example embodiments of the present disclosure.
Figure 8D:
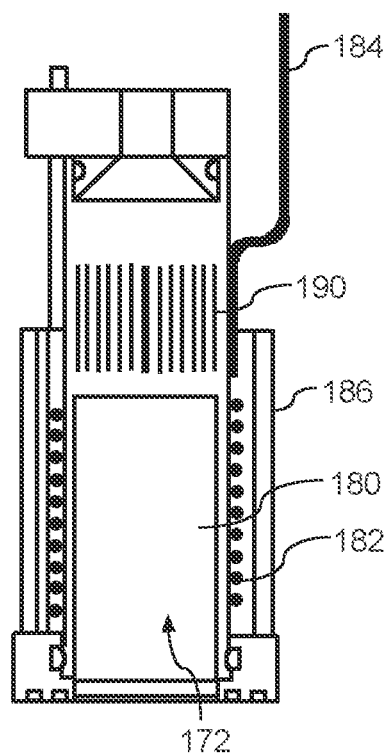
FIG. 8D depicts a cross-sectional view of an example hybrid plasma sourcelet according to example embodiments of the present disclosure.
Figure 15:
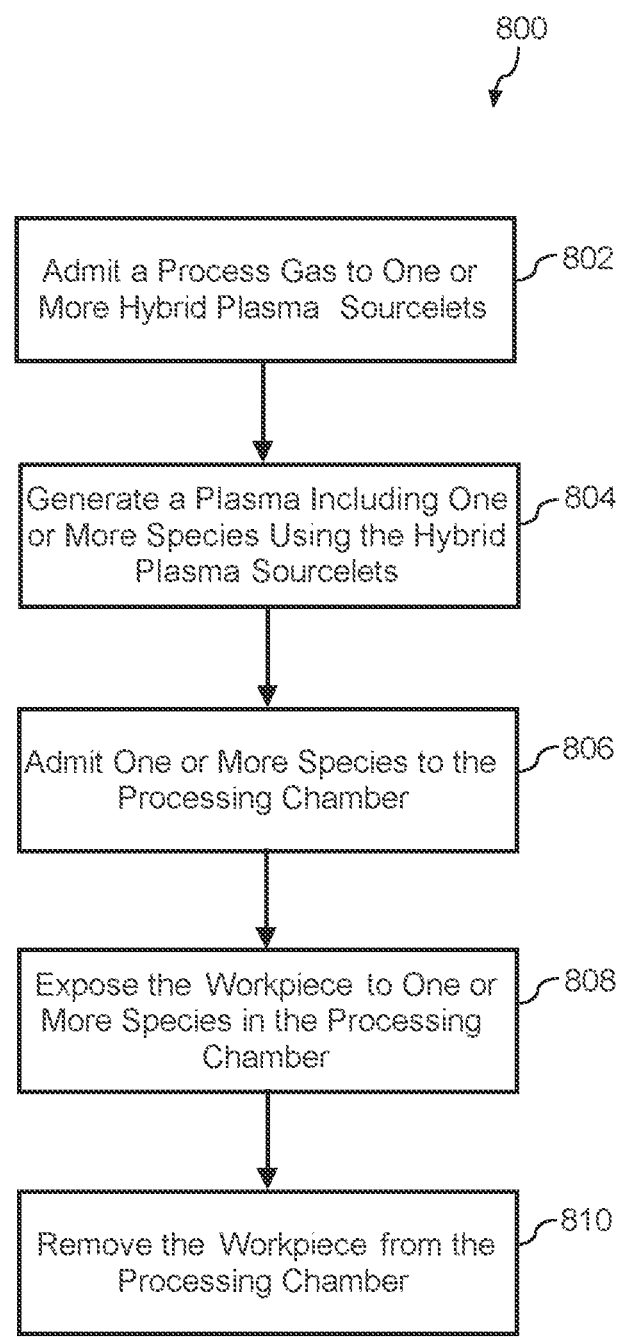
FIG. 15 depicts a flow chart diagram of a method for processing a workpiece according to example embodiments of the present disclosure.

FIG. 15 depicts a flow diagram of one example method (800) according to example aspects of the present disclosure. The method (800) will be discussed with reference to the plasma processing apparatus 100 of FIG. 1 by way of example. The method (800) can be implemented in any suitable plasma processing apparatus. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (802), the method can include admitting a process gas to one or more of the hybrid plasma sourcelets 133. For example, process gas can be supplied to one or more hybrid plasma sourcelets 133 of the plasma source array 130 via gas distribution system 155. For example, process gases can be delivered from a plurality of feed gas lines 159 and can be controlled using valves 158 and/or gas flow controllers 185 in order to delivery the desired amount of gas to each hybrid plasma sourcelet 133. The gas delivery system 155 can be used for the delivery of any suitable process gas. Example process gases include, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma source array 130 and/or processing chamber 110.

At (804), the method includes generating a plasma including one or more species from the process gas using the hybrid plasma sourcelet 133. For example, once process gas is supplied to one or more of the hybrid plasma sourcelets 133, the capacitively coupled plasma source 190 can be used to facilitate striking or igniting of the plasma within the dielectric tube 170 of the hybrid plasma sourcelet 133. Further, the gas distribution plate 252 can be utilized to move process gas from a top portion and through the capacitively coupled plasma source 190 to a bottom portion of the dielectric tube 170. Once ignited, an inductively coupled plasma source 180 can be utilized to generate plasma within the dielectric tube 170. For example, each hybrid plasma sourcelet 133 can include a inductively coupled plasma source 180 including an induction coil 182. The induction coil 182 can be coupled to an RF power generator 134 through a suitable matching network 132. When the induction coil 182 is energized with RF power from the RF power generator 134, a plasma can be generated in an inner area 172 of the dielectric tube 170.

At (806), the method includes admitting one or more species to the processing chamber 110. For example, once plasma is produced within the inner area 172 of the dielectric tubes 170, the plasma can flow from the tubes 170 through apertures 140 located in the base plate 136 and into the processing chamber 110 in order to process workpiece 114. Additionally, in certain embodiments, the plasma generated by the plasma source array 130 can optionally be filtered by a separation grid, that is located between the base plate 136 and the workpiece 114.

Optionally, a separation grid 200 can be provided between the processing chamber 110 and the plasma source array 130. The separation grid 200 can be used to perform ion filtering from plasma generated by the plasma source array 130 as it is delivered into the processing chamber 110. For example, the plasma generated by the plasma source array 130 can be filtered by the separation grid 200 in order to generate a filtered mixture in the processing chamber 110. The filtered mixture including one or more species can be exposed to the workpiece 114 in the processing chamber 110. The separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles. Accordingly, in certain embodiments, the plasma generated can be filtered by the separation grid to create a filtered mixture. The filtered mixture can then be exposed to the workpiece 114.

At (808), the method includes exposing the workpiece to one or more species in the processing chamber 110. As noted, plasma generated by the hybrid plasma sourcelets 133 can be provided into the processing chamber 110 via one or more apertures 140 located on a bottom surface of the base plate 136. Indeed, in certain embodiments, each hybrid plasma sourcelet 133 is placed over a suitable aperture such that plasma generated by the sourcelet 133 can be delivered to the processing chamber and exposed to workpiece 114.

At (810), the method includes removing the workpiece 114 from the processing chamber 110. For instance, the workpiece 114 can be removed from workpiece support 112 in the processing chamber 110. The plasma processing apparatus 100 can then be conditioned for future processing of additional workpieces.

Example processing parameters that can be used in plasma processing apparatus according to example aspects of the present disclosure are below (for 300 m workpiece processing:

Pressure: 2 mT to 5 Torr
Temperature: 20° C. to 250° C.
Gas Flows: 5 sccm to 5 slm While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A plasma source array, comprising:
a plurality of hybrid plasma sourcelets disposed on a base plate, each hybrid plasma sourcelet comprising:
a dielectric tube having an inner area and an outer surface;
an inductively coupled plasma source for generating a inductively coupled plasma disposed proximate to the outer surface of the dielectric tube;
a capacitively coupled plasma source for generating a capacitively coupled plasma disposed within the inner area of the dielectric tube; and
a gas injection system configured to supply one or more process gases to the inner area of the dielectric tube, wherein the base plate comprises a plurality of apertures disposed beneath each of the hybrid plasma sourcelets, wherein the capacitively coupled plasma source is disposed above the inductively coupled plasma source in a Z-direction.

2. The plasma source array of claim 1, wherein the inductively coupled plasma source comprises one or more induction coils disposed around a portion of the outer surface of the dielectric tube.

3. The plasma source array of claim 1, wherein the capacitively coupled plasma source comprises one or more electrodes disposed within a portion of the inner area of the dielectric tube.

4. The plasma source array of claim 3, wherein the capacitively coupled plasma source comprises at least two electrodes disposed within the dielectric tube.

5. The plasma source array of claim 1, wherein the capacitively coupled plasma source is configured to facilitate striking and/or ignition of a plasma.

6. The plasma source array of claim 1, wherein the inductively coupled plasma source is configured to facilitate plasma generation within a portion of the inner area of the dielectric tube.

7. The plasma source array of claim 1, wherein each hybrid plasma sourcelet comprises a gas distribution plate.

8. The plasma source array of claim 7, wherein the gas distribution plate comprises one or more channels disposed between one or more electrodes of the capacitively coupled plasma source to provide the one or more process gases from a top portion of the hybrid plasma sourcelet through the capacitively coupled plasma source to a bottom portion of the hybrid plasma sourcelet.

9. The plasma source array of claim 1, wherein the inductively coupled plasma source is configured around a bottom portion of the dielectric tube, the bottom portion of the dielectric tube having a height in the z-direction of from about 20 mm to about 80 mm.

10. The plasma source array of claim 1, wherein the dielectric tube has a diameter of from about 10 mm to about 500 mm.

11. The plasma source array of claim 1, wherein the dielectric tube has a diameter of from about 10 mm to about 40 mm.

12. The plasma source array of claim 1, wherein the hybrid plasma sourcelet comprises a shield disposed around at least a portion of the outer surface of the hybrid plasma sourcelet.

13. The plasma source array of claim 12, wherein the shield comprises a ferrite shield.

14. The plasma source array of claim 12, wherein the shield is disposed external to the inductively coupled plasma source.

15. The plasma source array of claim 1, wherein each hybrid plasma sourcelet comprises a single-power feed configured to supply power from one or more power sources to both the inductively coupled plasma source and the capacitively coupled plasma source.

16. The plasma source array of claim 15, wherein the one or more power sources comprise an RF power source, a DC power source, an AC power source, or a combination thereof.

17. The plasma source array of claim 1, wherein one or more brackets are configured to secure each hybrid plasma sourcelet to the base plate.

18. The plasma source array of claim 1, wherein the plasma source array comprises at least 5 to about 45 hybrid plasma sourcelets disposed on the base plate.

19. The plasma source array of claim 1, wherein a first group of the hybrid plasma sourcelets are each coupled to a first power source, and a second group of the hybrid plasma sourcelets are each coupled to a second power source, wherein the first power source is different from the second power source.

20. The plasma source array of claim 1, wherein the base plate has a baseplate footprint and an individual hybrid plasma sourcelet has a sourcelet footprint, wherein the sourcelet footprint is less than 20% of the baseplate footprint.

21. The plasma source array of claim 20, wherein the base plate has a base plate footprint and each hybrid plasma sourcelet has a sourcelet footprint, wherein the sourcelet footprint is less than 10% of the base plate footprint.

* * * * *